Dec. 2, 1958 E. KEONJIAN 2,863,008

STABILIZED AMPLIFIER

Filed Aug. 27, 1954 2 Sheets-Sheet 1

INVENTOR:
EDWARD KEONJIAN,

BY George V. Eltgroth
HIS ATTORNEY.

Dec. 2, 1958 E. KEONJIAN 2,863,008

STABILIZED AMPLIFIER

Filed Aug. 27, 1954 2 Sheets-Sheet 2

INVENTOR:
EDWARD KEONJIAN,

BY George V. Eltgroth

HIS ATTORNEY.

2,863,008
Patented Dec. 2, 1958

2,863,008

STABILIZED AMPLIFIER

Edward Keonjian, Syracuse, N. Y., assignor to General Electric Company, a corporation of New York Application August 27, 1954, Serial No. 452,607
8 Claims. (Cl. 179—171)

This invention relates to signal responsive networks, and more particularly to tandem connected complementary solid state amplifiers.

Earlier workers have previously discovered many of the advantages of tandem connected complementary type transistor amplifiers. Some of these workers have suggested their utilization in push-pull configurations, adapted for excitation from a single signal source. When negative feed back is added to such amplifier configurations, it has been found that there may exist conditions of objectionable distortion in certain ranges of power output.

Accordingly, it is a principal object of the invention to provide a new and improved amplifier circuit employing a complementary arrangement of transistors.

It is a further object of the invention to provide new and novel arrangements for stabilizing transistor amplifier characteristics in the presence of changing temperature.

Another object of the invention is to provide a new and improved transistor amplifier having enhanced life and reliability.

These and other objects and advantages of the invention will be more fully discussed in, and others will become apparent from a study of, the following specification when read in conjunction with the drawings, which illustrate representative specific embodiments for the purpose of illustrating the principles of the invention. The invention is pointed out with particularity in the appended claims, forming a part of this specification. In the drawings:

Figure 1:
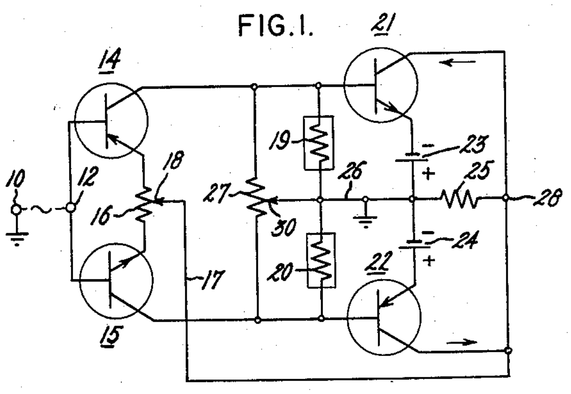
Figure 1 is a schematic diagram of an amplifier employing tandem connected complementary type transistor amplifiers.

The amplifier network shown in Figure 1 is excited from a source connected between the grounded input terminal 10 and the ungrounded input terminal 12. Input terminal 12 is connected with the base electrode of a P–N–P transistor 14 and with the base electrode of an N–P–N transistor 15. The emitters of the transistors 14, 15 are connected with either end of a resistance 16 provided with a movable tap 18. The collector of the P–N–P transistor 14 is connected with the base of an N–P–N transistor 21, while the collector of the N–P–N transistor 15 is connected with the base of a P–N–P transistor 22. A resistor 27 provided with a movable tap 30 is bridged between the base electrodes of transistors 21, 22. The collectors of transistors 21, 22 are connected together and to one terminal of the load device 25. A grounded line 26 connects the movable tap 30 and the end of the load device 25, which is remote from point of connection 28 with the collectors of transistors 21, 22. The emitter of transistor 21 is connected with the negative pole of the source 23, whose positive pole is connected with the line 26. Similarly, the emitter of transistor 22 is connected with the positive pole of the source 24, whose negative pole is connected with line 26. The sources 23, 24 may each have a potential of about 10 volts. A further connecting line 17 links the point 28 in the circuit collector of transistors 21, 22 with the movable tap 18 on the resistor 16.

A thermally responsive resistor 19 having a negative temperature coefficient is connected between the base electrode of the transistor 21 and the line 26, while another thermally responsive resistor 20 having a negative temperature coefficient is connected between the base of transistor 22 and the line 26.

The value of resistance 16 is comparable with the emitter resistance of transistors 14, 15, while the resistors 19, 20, 27 provide a network whose resistance is comparable with the base input impedance of transistors 21, 22. The load device 25 may present a relatively low value, of the order of 30 ohms or less, due to the low source impedance arising out of the negative feed-back connection.

The application of signal currents to the transistors 14, 15 causes collector circuit currents in transistors 21, 22 which are reversed in phase. With proper selection of source voltages and impedance values, as is well known, this system may be operated as a high efficiency class B amplifier.

In general, the transistor amplifier of Figure 1 is operated under a wide range of temperatures. Assuming an increase in temperature, and identical transistor response to temperature changes the collector currents of transistors 14 and 15 increase, to produce like changes in emitter current of transistors 21, 22, with resulting equal changes in the collector current flowing in transistors 21, 22, whereby no resulting voltage appears across the load device 25.

In the foregoing paragraph, which assumed identity of transistor characteristics at all temperatures, it would seem that changes in ambient temperature introduce no limitations, save the diminished power output resulting from the fact that collector current excursions cannot exceed a predetermined peak value and that increasing residual collector current reduces the magnitude of the permissible signal controlled current peaks.

However, such identity of transistor characteristics is rare indeed, as is the probability of the occurrence of identities in nature under any circumstances. Therefore, a true analysis of the circuit, corresponding to experimental observations, must accommodate the practically existing fact that there exists a residual circuit unbalance changing with temperature.

When the collector currents flowing in the transistors 21 and 22 are equal, there is no flow of current through the load 25, so that the collector end 28 of this load is substantially at ground potential. The polarity of the feed-back from the load device 25 to the input circuit of the transistors 14 and 15 is negative. Therefore, if the collector end of the load 25 becomes positive, this potential change is communicated to the tap 18 on the resistance 16, increasing the flow of collector current in transistors 14 and 21 whereby the collector end of the load device 25 tends to become less positive. The reverse effect occurs when, for any reason, the collector end of the load device 25 becomes more negative.

As mentioned a balanced condition of the circuit of the Figure 1 occurs only rarely, and even when encountered does not long exist. Accordingly, an assumption of equal collector currents flowing in transistors 21 and 22 is untenable from a practicable standpoint. Deviations from a perfectly balanced circuit, especially those deviations induced by different thermal characteristics of the transistors, give rise to appreciable and annoying distortion particularly at low and intermediate power levels.

The amplifier of Figure 1 is of the type generally designated class B, which is to say that signal waves of one polarity are amplified in one branch of the network, while signal waves of the other polarity are amplified in another branch of the network. Typically, distortion, in such amplifiers may arise from an irregular transfer characteristic, and from different degrees of amplification of the respective halves of the signal wave. The invention whose principles are being described here is particularly effective in avoiding disturbance of the transfer characteristic arising from unlike thermally induced variations in the collector current flowing in the two branches.

Generally speaking the network of Figure 1 will be unbalanced when its fabrication is completed, or, if balanced after completion of fabrication, it will become unbalanced when exposed to different ambient temperatures. Let it be assumed at this point, for the purposes of discussion, that the collector currents in transistors 21 and 22 are balanced at a representative temperature of 20° C. If the ambient temperature be now increased to 40° C., it is found that due to thermally induced variations in the collector current there are unequal changes in the collector current observed in the two branches. The collector current, it will be recalled, is a composite of at least two components. One of these components is influenced by the emitter current, while the other component is influenced by the temperature of the depletion layer operationally associated with the collector junction. Let it further be assumed, now, that the collector current in the branch 14, 21 increases more rapidly with temperature than the collector current in the branch including transistors 15, 22. This results in a current flow through the load device 25, which makes the junction 28 more negative with respect to ground. This negative shift in potential is transmitted to the tap 18 on the resistor 16, where it diminishes the flow of the emitter current in transistor 14, to produce a decrease in the signal controlled portion of the collector current flowing in the transistor 21. With a sufficient thermally induced increase in the collector current flowing in transistor 21, the signal controlled portion of the collector current may be entirely suppressed, and there may exist a threshold of input signals in this branch below which no signal controlled current flows in the output circuit of the transistor 21.

This gives rise to an irregularity in the transfer characteristic causing high distortion in the region of 5 to 20 percent of the maximum power output of the amplifier and further giving rise to rectification in the output circuit of the transistor amplifier. In addition the resultant direct current component flowing in the load device 25 may be objectionable.

The combination of adjustable fixed resistors and thermally variable resistors in Figure 1 avoids temperature induced alterations in the transfer characteristic between the two amplifier branches. The position of the tap 18 on the resistance 16 is adjusted to eliminate any D. C. potential appearing across the load device 25 when the amplifier is in equilibrium with an ambient temperature near the lower portion of its temperature operating range. The amplifier unit is then brought up to an ambient temperature near the upper end of its operating range and the position of the tap 30 on the resistance 27 is adjusted to again eliminate the existence of any direct potential across the load device 25. For the utmost precision of adjustment, it may be necessary to continue this adjustment sequence through one or two additional temperature cycles, depending upon the degree of freedom from distortion required. A somewhat modified shaping of the temperature compensation adjustment characteristic may be obtained by leaving the common connection of resistances 19, 20 free from ground.

Figure 2:
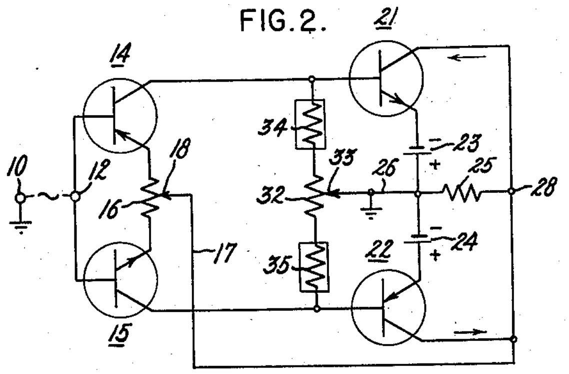
Figure 2 is a schematic diagram illustrating a somewhat different deployment of elements forming a push-pull tandem connected temperature stabilized transistor amplifier.

Figure 2 shows another amplifier configuration which has the advantage of temperature stabilized balance. In this and in Figure 3 parts corresponding to the parts of Figure 1 are identified by corresponding reference characters. The signal is applied between the grounded input terminal 10 and the input terminal 12 which is connected with the respective bases of P–N–P transistor 14 and N–P–N transistor 15. The resistance 16 is connected between the emitters of transistors 14, 15 and a tap 18, movable thereover, is connected with the line 17 leading to the collectors of transistors 21, 22 and junction 28.

The temperature responsive resistance 34 having a negative temperature coefficient is connected at one end with the base of N–P–N transistor 21, and a similar resistor 35 is connected at one end with the base of P–N–P transistor 22. A resistance 32 is connected between the remaining ends of resistors 34 and 35. A movable tap 33 is operatively associated with resistance 32 and connected with ground over the line 26. The emitter of transistor 21 is connected with the negative pole of source 23, whose positive pole is connected with the line 26, while the emitter of transistor 22 is connected with the positive pole of source 24 whose negative pole is also connected with the line 26. As in Figure 1, the potential delivered by the respective sources 23, 24 may be 10 volts. The load device 25 is connected between the junction 28 on the line linking the collectors of transistors 21, 22 and the ground line 26. The collector of transistor 14 is connected with the base of transistor 21 while the collector of transistor 15 is connected with the base of transistor 22.

The amplifier network of Figure 2 also enjoys the advantage of essentially balanced operation through wide range of temperatures. To achieve this, adjustment is made in a manner similar to that already outlined in Figure 1. With the amplifier elements at a temperature corresponding to the lower portion of the expected operating range of temperatures, the tap 18 is adjusted on the resistance 16 to eliminate the presence of any direct current component of voltage across the load device 25. The temperature of the amplifier network is then brought to a point near the expected maximum operating temperature, and the circuit is rebalanced by adjustment of the tap 33 on the resistance 32 for a minimum D. C. potential across the load device 25. This procedure may be repeated through several temperature cycles to achieve the necessary precision of balance. Through the thermal balance stabilization so achieved, the transfer characteristic is maintained without significant irregularities, so that objectionable harmonic content at low power outputs is avoided.

Figure 3:
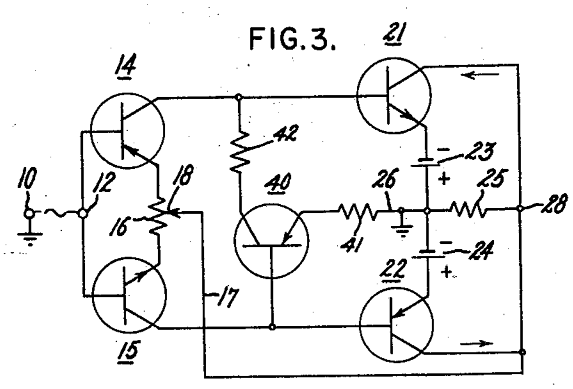
Figure 3 illustrates a push-pull tandem connected complementary type transistor amplifier in which a transistor is employed as the thermal stabilizing element.

Figure 3 shows still another arrangement for thermally stabilizing the balance point of a tandem connected push-pull amplifier. The signal input takes place between the grounded input terminal 10 and the terminal 12 which is connected with the base electrodes of the P–N–P transistor 14 and the N–P–N transistor 15. The emitters of transistors 14 and 15 are connected together through resistance 16 over which a tap 18 moves adjustably. The tap 18 is connected with the collectors of N–P–N transistor 21 and P–N–P transistor 22 over the line 17 leading to the junction 28. The collector of transistor 14 is connected with the base of transistor 21, while the collector of transistor 15 is connected with the base of transistor 22.

A load device 25 is connected between the junction 28 on the collector line linking transistors 21, 22 and the ground line 26. In addition, a source 23 has its positive pole connected with the ground line 26 and its negative pole connected with the emitter of transistor 21, while the source 24 has its negative pole connected with the ground line 26 and its positive pole connected with the emitter of transistor 22. Ten volts represents a suitable potential for the sources 23, 24.

Temperature stabilization is provided by an additional transistor 40, preferably having thermal time constant characteristics most nearly resembling those of transistors 14 and 15. The base of transistor 40 is connected with the base of transistor 22, while the collector of transistor 40 may be connected with the base of transistor 21 through a resistance 42. A resistance 41 connects the emitter of transistor 40 with the ground line 26. The P–N–P transistor 40 in Figure 3 provides thermally variable resistors in the form of the resistance presented by the collector and emitter junctions when reversely biased. The resistors 41 and 42 are included to provide for adjustment of the resistance-temperature characteristics of the network, and one or both may be made variable if it is desired to make the high temperature operating balance adjustable.

The method of adjustment of the network Figure 3 follows the same pattern as the previously described networks. When the temperature of the amplifier network is near the lower region of its expected ambient operating range, the tap on resistance 18 is adjusted to reduce the direct current component across the load device 25 to a minimum value. If the magnitude of the resistances 41 and 42 has been properly set by design considerations and is fixed, the network will now also be in balanced condition when operating at temperatures in the higher region of expected ambient conditions. However, as mentioned earlier, one or both of the resistances 41, 42 may be made adjustable to permit final precise adjustment of this balance in the operating location.

The transistor 40 has been shown as a P–N–P transistor. In the network of Figure 3, the P–N–P transistor 40 can be replaced by an N–P–N transistor through interchanging the base and collector connections thereto. In like manner, where N–P–N transistors have been shown they may be replaced by P–N–P transistors and conversely, with due observance of the necessary adjustments in exciting source polarities.

Figure 4:
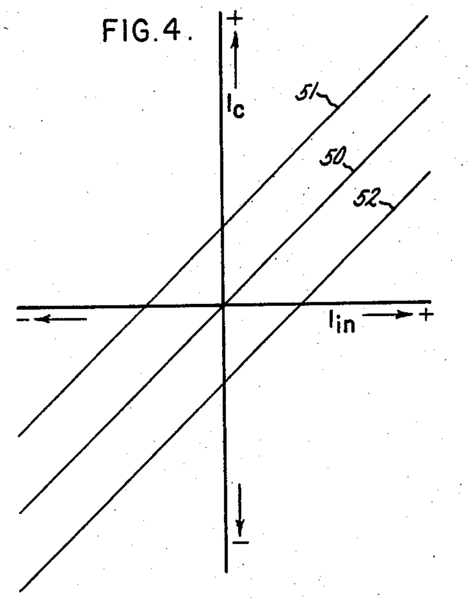
Figure 4 represents graphically several transfer characteristics observed in tandem connected complementary balanced transistor amplifiers with negligible residual collector currents.
Figure 5:
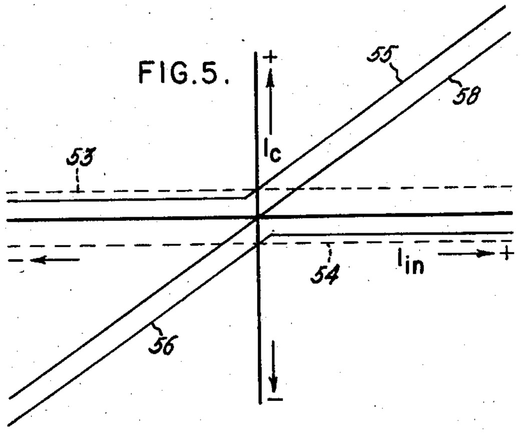
Figure 5 represents graphically a transfer characteristic observed in a tandem connected complementary balanced transistor amplifier with significant, but balanced, residual collector currents.
Figure 6:
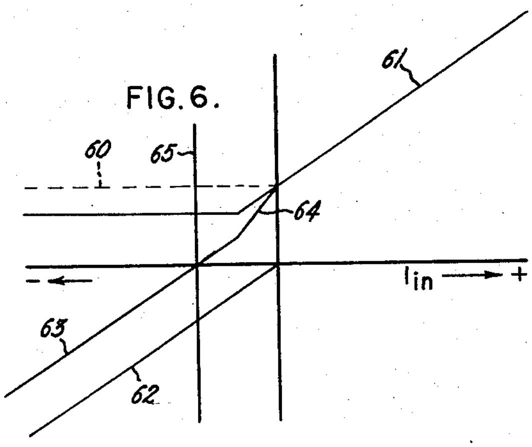
Figure 6 represents graphically a transfer characteristic observed in a tandem connected complementary nominally balanced transistor amplifier with appreciable unbalanced collector currents.

The change in the shape of the transfer characteristic which occurs in the presence of severely unbalanced thermal characteristics of the transistors is treated in connection with Figures 4, 5 and 6.

Figure 4 illustrates the transfer characteristic of a pair of transistor amplifiers in which the collector current produced by the thermal generation of hole-electron pairs is negligible. The portion of the curve 50 to the right of the collector current axis represents the change in collector current in the upper branch of the circuit as the emitter current is varied, while the portion of curve 50 to the left of the collector current axis indicates the change in the collector current in the lower branch of the circuit as the emitter current is varied. When the potential of the tap 18 is made positive, the composite characteristic is displaced to operate along the line 51. If the potential of the tap 18 be made negative, the operating characteristic is displaced, as indicated by the line 52 in Figure 4. It will be noted that whatever the nature of the displacement, the transfer characteristic remains linear and no additional terms are produced in the output by the application of a signal wave $I_m=F(t)$ to the input, where $I_m$ represents input current and $F(t)$ indicates a function of time.

Figure 5 illustrates the current and operating characteristics which are observed when the ambient temperature is increased to a value such that thermally produced hole-electron pairs give rise to appreciable, but equal collector currents. The residual collector current which flows in one of the branches of the network Figure 1 in the presence of the elevated ambient temperature is indicated by the dashed-line 53, the residual collector current appearing in the other branch of the circuit under these conditions being represented by the dashed-line 54. It will be noted that these collector currents are equal and opposite. The collector current which is observed to flow in the first branch of the network in the presence of a signal is shown by the curve 55, while the current flowing in the other branch in the presence of a signal is shown by the curve 56. On careful examination of the curve 55, it is noted that there is some decrease in the collector current in the presence of negative emitter currents and from the curve 56, it appears that there is some decrease in the corresponding collector current for positive emitter currents. However, when the two curves are combined to obtain the composite transfer characteristic, there is obtained the characteristic curve 58 which is linear and passes through the origin. Accordingly, so long as the thermally induced variations in the collector current are symmetrical, the application of a signal wave $I_{in}=F(t)$ to the input results in the development of a signal controlled collector current $I_c=AF(t)$ at the output, with no significant introduction of harmonic terms, as indicated by the fact that A is a constant.

In practice, however, as has been earlier mentioned, the collector currents due to the thermal generation of hole-electron pairs are not observed to increase symmetrically. Figure 6 represents such a condition in exaggerated fashion, where the residual collector current in one branch of the network is shown at 60. The characteristics of the other branch are such that a much smaller thermally induced increase in the collector current occurs. With different emitter currents, the collector current in the first branch of the network varies along the line 61, which includes a region to the left of the collector current axis in which there is partial suppression of the residual collector current. Increasing values of negative emitter current give rise to an operating characteristic shown at 62 in the other branch of the network. The combination of the two operating characteristics gives rise to the new characteristic 63, including a portion of different slope in the limb 64. Due to the feed-back included within the amplifier, the operating point of the composite network is shifted to the intersection of a new ordinate 65 with the emitter current axis. The application of signals now causes excursion of the collector current over portions of the characteristic curve having different slopes, whence the application of a signal wave $I_{in}=F(t)$ to the input results in the development of a signal controlled collector current $I_c=g(t)$ at the output, which contains terms not present in the input signal, since $g(t)$ represents a different time variable function than $F(t)$.

Thermal readjustment of the relative values of the components in the network branches, according to the invention, establishes equality of residual collector currents, restoring the circuit to operating conditions corresponding to Figure 5, which eliminate the additional distortion terms.

The specific embodiments shown and discussed have been shown to illustrate the principles of the invention. As is well known to those skilled in the art, and the array and disposition number or character of elements may be varied to meet particular operating or environmental requirements without departing from the essence of the invention.

What is claimed as new and to be secured by Letters Patent of the United States is:

1. In combination, first and second transistors of complementary type, a resistance connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector of said second transistor, an output device including a power supply having at least one terminal connected with the collectors of said third and fourth transistors, said output device having another terminal connected to said common point, a second resistance diminishing in magnitude with increasing temperature connected between the base members of said third and fourth transistors, said second resistance having an intermediate point thereon connected to said common point, and a connection linking said at least one terminal of said output device with said intermediate point of connection on said first resistance.

2. In combination, first and second transistors of complementary type, a first resistance connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector of said second transistor, an output device including a power supply having at least one terminal connected with the collectors of said third and fourth transistors, said output device having another terminal connected to said common point, a second resistance diminishing in magnitude with increasing temperature connected between the base members of said third and fourth transistors said second resistance having an intermediate point thereon connected to said common point, a third resistance connected between the base members of said third and fourth transistors and having an adjustable intermediate point of connection, means connecting the intermediate point of connection on said first resisance with said at least one terminal of said device, and means connecting the intermediate point of connection on said third resistance to said common point.

3. In combination, first and second transistors of complementary type, a first resistance connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector of said second transistor, an output device including a power supply having at least one terminal connected with the collectors of said third and fourth transistors, said output device having another terminal connected to said common point, a second resistance connected between the base members of said third and fourth transistors and having an adjustable intermediate point of connection, a third resistance diminishing in magnitude with increasing temperature connected between the base member of said third transistor and said common point, a fourth resistance diminishing in magnitude with increasing temperature connected between the base member of said fourth transistor and said common point, means connecting the intermediate point of connection on said first resistance with said at least one terminal of said output device, and means connecting the intermediate point of connection on said second resistance with said common point.

4. In combination, first and second transistors of complementary type, a first resistive means connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector of said second transistor, an output device including a power supply having at least one terminal connected with the collectors of said third and fourth transistors, said output device having another terminal connected to said common point, a second resistive means varying with temperature connected at one end with the base of said third transistor, a third resistive means varying with temperature connected at one end with the base of said fourth transistor, means connecting said intermediate point of connection on said first resistive means with said at least one terminal of said output device, and means connecting the other ends of said second and third resistive means with said common point.

5. In combination, first and second transistors of complementary type, a first resistive means connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector of said second transistor, an output device including a power supply having at least one terminal connected with the collectors of said third and fourth transistors, said output device having another terminal connected to said common point a second resistive means varying with temperature connected at one end with the base of said third transistor, a third resistive means varying with temperature connected at one end with the base of said fourth transistor, fourth resistive means connected between the other ends of said second and third resistive means, said fourth resistor having an adjustable intermediate point of connection, means connecting said intermediate point of connection of said first resistive means with said at least one output terminal of said output device, and means connecting said intermediate point of connection of said fourth resistive means with said common point.

6. In a signal responsive system, first and second transistors of complementary type, resistive means connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector and said second transistor, an output device including a power supply having at least one terminal connected with the collectors of said third and fourth transistors, said output device having another terminal connected to said common point a fifth transistor having one electrode connected with the base of said third transistor, a second electrode connected with the base of said fourth transistor, and another electrode connected with said common point, and means connecting said intermediate point of connection to said resistive means with said at least one terminal of said output device.

7. In a signal responsive system. first and second transistors of complementary type, resistive means connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector of said second transistor, an output device including a power supply having at least one terminal connected with the collectors of said third and fourth transistors, said output device having another terminal connected to said common point a fifth transistor having its collector electrode connected with the base of said third transistor, its base electrode connected with the base of said fourth transistor, and its emitter electrode connected to said common point, and means connecting said intermediate point of connection to said resistive means with said at least one terminal of said output device.

8. In a signal responsive system, first and second transistors of complementary type, resistive means connecting the emitters of said first and second transistors and having an adjustable intermediate point of connection, means for applying a signal between the base electrodes of said first and second transistors and a common point, a third transistor of type complementary to said first transistor having its base connected with the collector of said first transistor, a fourth transistor of type complementary to said second transistor having its base connected with the collector of said second transistor, an output device including a power supply having at least one terminal connected with the collectors of said third and fourth transistors, said output device having another terminal connected to said common point a fifth transistor having its collector electrode resistively connected with the base of said third transistor, its base electrode connected with the base of said fourth transistor, and its emitter electrode resitively connected with said common point and means connecting said intermediate point of connection to said resistive means with said at least one terminal of said output device.

References Cited in the file of this patent

UNITED STATES PATENTS

| | | |
|---|---|---|
| 1,924,469 | Strecker | Aug. 29, 1933 |
| 2,070,071 | Stromeyer | Feb. 9, 1937 |
| 2,761,917 | Aronson | Sept. 4, 1956 |

OTHER REFERENCES

Sziklai article, Proc. I. R. E., June 1953, pages 717–719, 179–171–MB.

Shea text, "Principles of Transistor Circuits," pages 120–121, 156, 163–181, pub. 1953 by John Wiley & Sons, N. Y. C. (Copy in Div. 69.)

UNITED STATES PATENT OFFICE

CERTIFICATE OF CORRECTION

Patent No. 2,863,008 December 2, 1958

Edward Keonjian

It is hereby certified that error appears in the printed specification of the above numbered patent requiring correction and that the said Letters Patent should read as corrected below.

Column 8, line 63, for "and said" read -- of said --; column 10, line 11, for "resitively" read -- resistively --.

Signed and sealed this 12th day of May 1959.

(SEAL)

Attest:

KARL H. AXLINE

Attesting Officer

ROBERT C. WATSON

Commissioner of Patents